US005681775A

United States Patent [19]

Pogge

[11] Patent Number: 5,681,775
[45] Date of Patent: Oct. 28, 1997

[54] SOI FABRICATION PROCESS

[75] Inventor: H. Bernhard Pogge, Hopewell Junction, N.Y.

[73] Assignee: International Business Machines Corporation, Armonk, N.Y.

[21] Appl. No.: 559,383

[22] Filed: Nov. 15, 1995

[51] Int. Cl.$^6$ .................................................. H01L 21/76
[52] U.S. Cl. ........................... 437/62; 437/86; 437/974; 148/DIG. 12; 156/630.1
[58] Field of Search ........................... 437/86, 62, 974; 148/DIG. 12, DIG. 135; 156/629.1, 630.1, 632.1

[56] References Cited

U.S. PATENT DOCUMENTS

| 3,909,332 | 9/1975 | Yerman ................................. 156/309 |
| 4,481,707 | 11/1984 | Cunneff . | |
| 4,601,779 | 7/1986 | Abernathy et al. ................. 156/628 |
| 4,962,062 | 10/1990 | Uchiyama et al. ................. 437/225 |
| 4,983,251 | 1/1991 | Haisma et al. ...................... 156/630 |
| 5,028,558 | 7/1991 | Haisma et al. ...................... 437/62 |
| 5,086,011 | 2/1992 | Shiota ................................. 437/61 |
| 5,223,450 | 6/1993 | Fusino et al. . | |
| 5,238,865 | 8/1993 | Eguchi ............................... 437/62 |
| 5,286,671 | 2/1994 | Kurtz et al. ........................ 437/64 |
| 5,344,524 | 9/1994 | Sharma et al. ..................... 156/630 |
| 5,373,184 | 12/1994 | Moslehi ............................. 257/499 |

FOREIGN PATENT DOCUMENTS

| 59-218747 | 12/1984 | Japan . |
| 63-202034 | 8/1988 | Japan . |
| 63-248148 | 10/1988 | Japan . |
| 1-201937 | 8/1989 | Japan . |
| 4-111444 | 4/1992 | Japan . |
| 6-232245 | 8/1994 | Japan . |
| 6-334028 | 12/1994 | Japan . |

OTHER PUBLICATIONS

Robert Lineback, Electronics Week entitled "Buried Oxide Marks Route To SOI Chips", Oct. 1, 1984, pp. 11–12.

Kimura, M., et al, "Epitaxial Film Transfer . . . on an Insulating Substrate", Appl. Phys. Lett 43(3), 1 Aug. 1983 pp. 263–265.

O. Than, S. Buttgenbach entitled "Simulation of Anisotropic Chemical Etching of Crystalline Silicon Using a Cellular Automata Model", Jun. 16, 1994, pp. 85–89.

H. Seidel, L. Csepregi, A. Heuberger, H. Baumgartel, J. Electrochrm. Soc. vol. 137, entitled "Anistropic Etching of Crystalline Silicon in Alkaline Solutions", Nov. 11, 1990 pp. 3612–3632.

Linde, H., "Wet Silicon Etching . . . Gellates", J. Electrochem. Soc., vol. 139, No. 4, Apr. 1992 pp. 1170–1174.

Primary Examiner—George Fourson
Attorney, Agent, or Firm—Kris V. Srikrishnan

[57] ABSTRACT

A method of forming a SOI device layer on an oxide layer on top of a substrate is disclosed. The process involves using a device substrate of a first conductivity having a top device layer of a second conductivity. Optionally, a thin layer of silicon dioxide is formed on top of the device layer. A carrier substrate is selected with a surface layer of silicon dioxide. Patterns are etched into the device and carrier substrates to preselected depths and surface widths, in a roughly complementary manner. The etched surfaces present a slope which enables the easy assembly of the device substrate and carrier substrate, the depths of the complementary patterns are controlled by the dopant layer thickness, and the slopes of etched profile are determined by the crystallographic orientations of the silicon substrate. The device substrate is thinned away to leave the device layer over the carrier substrate, thereby forming a device layer on the carrier substrate, separated by a silicon dioxide layer.

32 Claims, 9 Drawing Sheets

5,681,775

SOI FABRICATION PROCESS

FIELD OF INVENTION

The present invention is in the field of manufacturing of silicon on insulator (SOI) structures and specifically to an improvement in the area of bonding and thinning of wafers.

BACKGROUND OF THE INVENTION

Silicon on insulator or SOI is a specialized area within semiconductor technology, and it broadly refers to the use of a thin silicon layer on an insulating surface for building devices such as field effect transistor (FET), bipolar etc. The devices built on SOI substrates have greater immunity to latch ups and to soft error. FIG. 1 shows a common type of SOI, in which a thin single crystal Si layer 20 (epitaxy layer) is formed on top of a silicon substrate 10 used as a carrier substrate, and an electrically insulating silicon dioxide layer 15 formed between layer 20 and substrate 10. In a common process used to fabricate such substrates, oxygen ions are implanted into Si substrate 10 below a certain depth and annealed to form $SiO_2$ layer 15 (R. J. Lineback, "Buried oxide Marks Route to SOI Chips", Electronics Week, Oct. 1, 1984). It is well known that implanting and forming buried oxide leads to large number of defects in device layers due to the volume expansion when silicon is converted to silicon dioxide. In a second common approach, related to the present invention, two substrates (Si wafers) with at least one having an oxide surface layer are physically brought together and bonding is established by annealing at high temperatures. FIGS. 2A–2C show a typical sequence of operations used in such a bonding process to build an SOI wafer. Referring to FIG. 2A, substrate 80 is a single crystalline wafer with an epitaxial layer 75 grown (deposited) on its surface. Layer 75 has a crystalline quality suitable for device formation, and it is usually doped with low concentration of n or p type impurities ($n^-$ or $p^-$). An oxide layer 70 is preferably formed over the epitaxial layer 75 by oxidation or deposition. The carrier substrate 50, contains a bonding layer 60 on its top surface, it usually being a layer of silicon dioxide. Substrates 50 and 80 are cleaned and wet treated to establish physical adhesion between layers 60 and 70. Referring to FIG. 2B, when the substrates are in physical contact and heated to a sufficiently high temperature, a strong chemical bonding develops between layers 60 and 70. Using selected thinning processes, substrate 80 is removed to leave behind epitaxial layer 75 on top of oxide layer 70 over substrate 50. The resultant structure is shown in FIG. 2C.

Key areas requiring improvement in the bonded SOI process are the selection of bonding layers 60 and 70, processes for forming bonding layers, bonding processes and processes for thinning substrate 80. A key problem in the bonded SOI process is the control of the SOI film thickness tolerance. For example, the supporting substrates 50, 80 are typically 0.5–1 mm thick with diameter in the range of 125 to 200 mm, whereas the thickness of the resultant device or epitaxial layer is usually in the range of 1000 Å. It is important that the processes used for thinning the substrate 80, do not affect the uniformity of the remaining epitaxial layer, which are typically thinner by three orders of magnitude. A combination of mechanical polish/wet etch techniques, along with polish and etch stops, are used in the thinning process. A common bonding problem is the formation of bubbles in bonding interface region due to the presence of dust particles on the surface of either substrates. Since even particles as small as 1000 Å can cause unacceptable bubbles, great precautions are taken to clean the surfaces and work only in an ultra clean ambient.

Kimura (APL, Vol. 43, No. 3, Aug. 1, 1983) teaches fabricating a first substrate by growing a p– epitaxial layer over a p+ substrate. A second substrate with an oxide layer is separately fabricated. The first substrate containing the epitaxial layer is coated with a glass layer. The surface of the glass layer of the first substrate and the oxide surface of the second substrate are bonded and heated to about 930° C. The first substrate is removed leaving behind the epitaxial layer over the bonded glass layers. Kimura does not provide any methods to control thickness uniformity in the device layer during the thinning process, nor techniques to reduce the formation of bubbles.

Abernathey et al., (U.S. Pat. No. 4,601,779) teaches the use of implanted etch stop layers near the interface between the p– epitaxial layer and the p+ substrate. Since the thin buried etch stop layer is formed by implantation, a highly uniform epitaxial layer can be realized. Abernathey's method depends on clean room environment to minimize losses due to bubble formation, and also experiences degradation of the device layer from the high temperature bonding process. Yerman (U.S. Pat. No. 3,909,332) teaches bonding of islands of p+ epitaxial single crystal regions surrounded by thermal oxide, by using boric glass layers between the device substrate and the support substrate. The substrates were mechanically pressed together and heated to cause the softening and flow of boric glass to establish the bonding. Yerman fails to teach methods for controlling the device layer thickness during the thinning process.

Uchiyama et al., (U.S. Pat. No. 4,962,062) teaches the use of a methanol/water mixture to hold two flat surfaces together, and by sliding the surfaces to remove bubbles and to promote strong surface tension bonding prior to annealing. In one of the embodiments, Uchiyama patterns open trenches on the surface of the epitaxial layer/device substrate, which on bonding and thinning become isolation features. Shiota (U.S. Pat. No. 5,086,011) teaches the use of plasma etching to thin the device substrate after bonding, but does not teach how to control device layer uniformity.

Sharma et al. (U.S. Pat. No. 5,344,524) teaches bonding at room temperature, followed by grinding and etching at room temperature to minimize the B diffusion from the p+ substrate into the p– region during the high temperature bonding process as practiced by prior art techniques.

Moslehi (U.S. Pat. No. 5,373,184) teaches bonding of a titanium metal on one substrate to a patterned polysilicon film on the second substrate. The raised patterned regions of the polysilicon reduces the total bonding areas to several islands, thereby minimizing dust concerns. Moslehi's process can leave microvoids in the final structure, which may not be acceptable for many applications, as they can trap chemicals and other impurities from subsequent processes. Kurtz et al, (U.S. Pat. No. 5,286,671) uses raised patterns to minimize concerns with dust particles and bubbles in fabricating piezo-resistive devices.

Eguchi (U.S. Pat. No. 5,238,865) teaches a method to overcome the problem of mechanical strain and delamination when semi-recessed oxide (SROX) regions 24 (projecting from surface) are formed selectively on a device layered wafer, as in FIG. 3A, and bonded to a flat substrate. Eguchi's solution, illustrated in FIGS. 3A–3C, is to provide recesses in the flat substrate corresponding to the projections in the SROX region to avoid the mechanical strain on the bonded interface. Accordingly, the bonded substrate 21 of FIG. 3B has a thick oxide layer 22 in which recesses 26 have been etched by dilute HF (hydrofluoric) providing a plurality of roughly rectangular recesses. As shown in FIG. 3A, the device wafer 23 is oxidized to create the SROX 24 high features, which fit into recesses 26 etched into substrate 21. FIGS. 3B–3C show the subsequent bonding and thinning steps and resultant structures. The raised regions and the recessed regions are approximately rectangular, but the recesses are made slightly larger so that bonding is not required along the sides. One of the major concern with this technique is that both device and support substrates (wafers) always have certain local distortions (curvatures), and the rectangular features are not forgiving in accommodating these local curvatures. Secondly, the etching process is controlled by preselected constant time and lead to large variations in the feature sizes. A likely concern with this technique is the thermal mismatch between the oxide regions in the support substrate and the silicon device regions in the device substrate, which during the bonding cycle can lead to local distortions and delaminations. A further disadvantage of the Eguchi process is that it entirely depends on SROX regions 24 to serve as polish stops when the device substrate is thinned. All of the above methods attempt to overcome problems with SOI fabrication in the areas of bonding, thinning of substrates, and reducing the sensitivity to foreign particles, but each of them suffers from some shortcomings as discussed. There is a clear need for a method that provides a high yielding SOI fabrication process, allows easy and precise alignment of substrates, has less sensitivity to dust particles, and permits controlled thinning to provide a uniform device layer.

OBJECTS OF THE INVENTION

An object of the present invention is to provide a manufacturing process for forming SOI substrates with improved yield and reliability.

A further object of the present invention is to provide a low cost manufacturing process, usable on large substrates and with improved immunity to dust particles during joining.

A still further object of the present invention is to improve uniformity of the device layer film thickness in SOI wafers.

Another object of the present invention is to provide a process that provides a self-aligned joining process for bonding the device and carrier substrates.

SUMMARY OF THE INVENTION

A method of forming a SOI device layer on an oxide layer on top of a substrate is disclosed. The process involves using a device substrate of a first conductivity having a top device layer of a second conductivity. Optionally, a thin layer of silicon dioxide is formed on top of the device layer. A carrier substrate is selected with a surface layer of silicon dioxide. Patterns are etched into the device and carrier substrates to preselected depths and surface widths, in a roughly complementary manner. The etched surfaces present a slope which enables the easy assembly of the device substrate and carrier substrate, the depths of the complementary patterns are controlled by the dopant layer thickness, and the slopes of etched profile are determined by the crystallographic orientations of the silicon substrate. The device substrate is thinned away to leave the device layer over the carrier substrate, thereby forming a device layer on the carrier substrate, separated by a silicon dioxide layer.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

The present invention creates a pattern of recesses (wells) in a support (carrier) substrate and raised regions (mesas or mounds) in a device substrate in a controlled and predictable manner, with the edges of the wells and mesas formed along selected crystallographic planes and directions. The mesas and wells are patterned by masks that produce mesas that are roughly complementary to the wells and vice versa. The respective mask patterns complement each other. The term "complementary" is used in this application in a broad manner. The patterns in the device and carrier substrates are opposite but the etched shapes can be different in depths of slopes, and the appearance of the high and low features. Only a rough matching of high surfaces and low surfaces is required. The areal size of the mesas and wells typically correspond to a single chip size, on the order of a square centimeter. The wells and mesas are formed with sloped sidewalls, by the appropriate choice of substrate orientations and etchants. Using anisotropic etchant solutions, the slope angle is determined precisely and predictably by the angles between crystallographic planes. These sloped sidewalls provide a great advantage when the substrates are brought together and when the mesas on one substrate are matched to the wells on a second substrate. Further, the top of the mesas are formed to be narrower than the top of the wells, enabling easy alignment and insertion.

Figure 4:
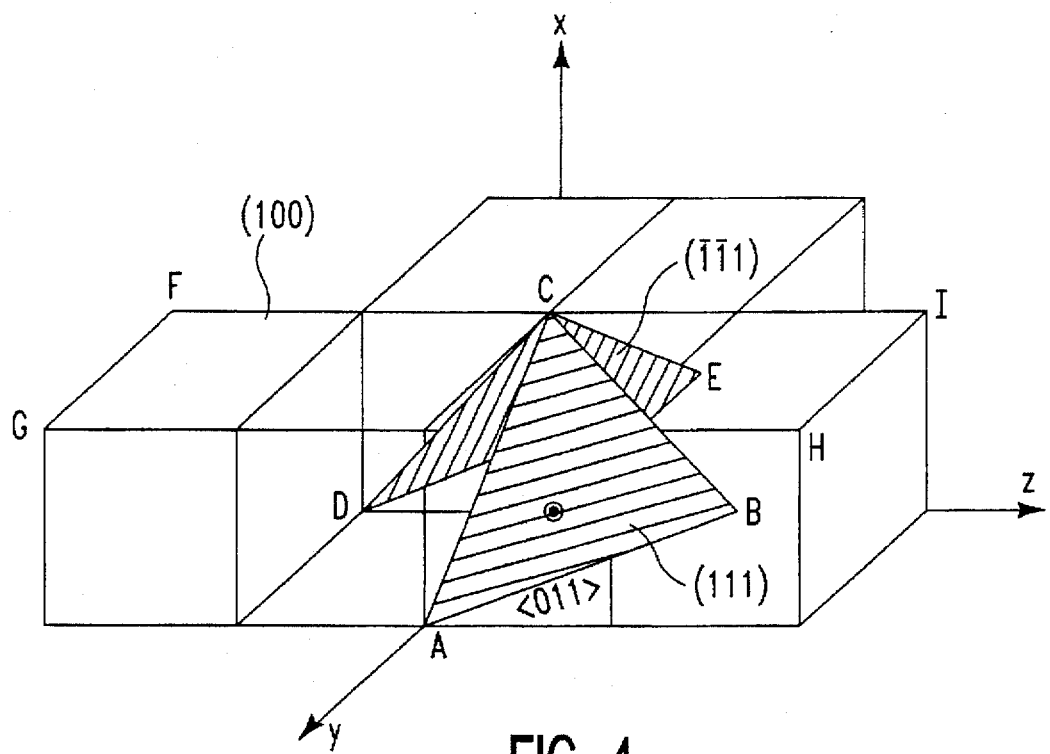
FIG. 4 is an illustration of crystallographic notations and crystal planes in a single crystalline material.

In creating these wells and mesas, the present invention takes advantage of the single crystalline nature of the silicon substrate and the preferred anisotropic etching along selected crystallographic planes by selected wet etchant chemicals. The conventional notation of crystallographic planes and directions in single crystals is known and described in text books. Some of the crystal planes and directions in the x-y-z coordinates that are of interest to the discussions in this application are shown in FIG. 4. The plane FGHI and its extension is a (100) plane, plane ABC is a (111) plane and line AB is along <011> direction. In a silicon lattice, there are fewer Si atoms per unit area on the (100) plane and more Si atoms per unit area on (111) planes. Because of symmetry, there are six planes in the (100) family of planes, such as (001), (010), (100), etc. and similarly there are eight planes in the (111) family of planes.

Several chemicals, such as potassium hydroxide or mixtures of ethylenediamine with pyrocatechol, are known to exhibit a strong anisotropy in etching single crystal Si ("Anisotropic Etching of Crystalline Silicon in Alkaline Solutions I and II", H. Seidel et al., J. Electrochemical Soc., Vol. 137, No. 11, November 1990, pp 3612–3632). Under selected concentrations and temperatures, the etch rate of (100) planes can be 15 to 100 times that of the (111) planes, leading to tapered etch profiles as shown in FIG. 5.

Figure 5:
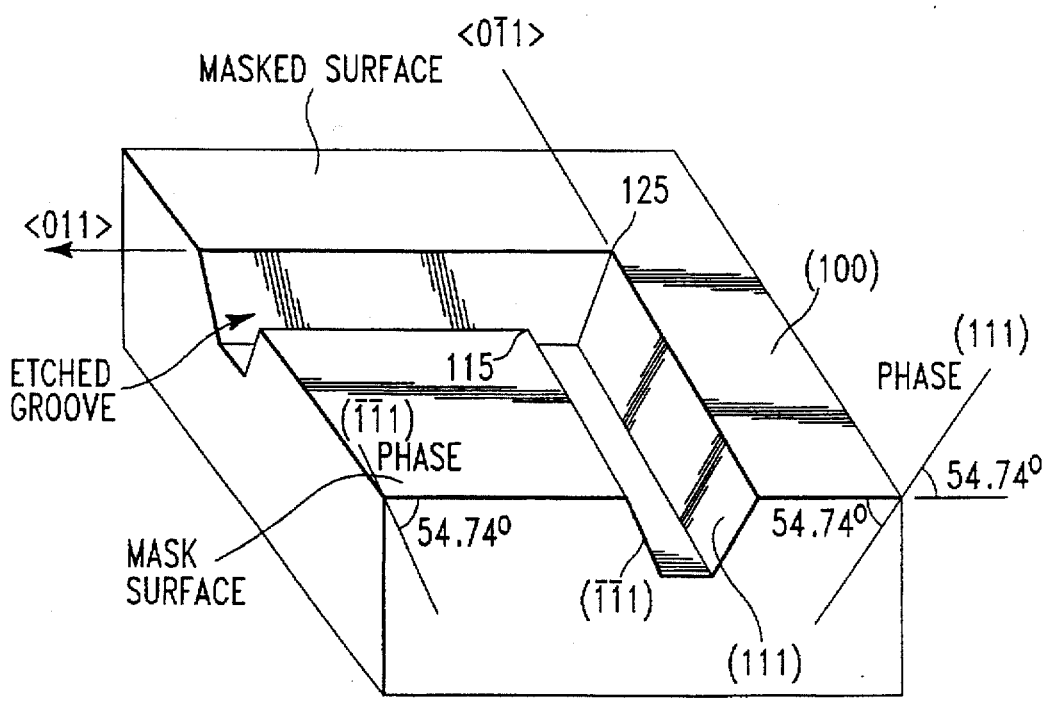
FIG. 5 is an illustration of a feature of preferred anisotropic etching in oriented Si crystals.

Referring to FIG. 5, when the top surface is a (100) plane, as is the case for most Si substrates used in modern semiconductor manufacturing, the anisotropic etchant attacks the region exposed by a mask on the surface, and it etches silicon on the (100) plane at some rate. When the etched surface reaches the <111> plane, the etch or removal rate of silicon on (111) plane becomes negligible, leading to a sloped sidewall profiles of the opening as shown. Since the (111) plane intersects the (100) plane along the <011> direction, and if the mask edges are aligned with the <011> direction as shown in FIG. 5, then the etched surface in the z-direction becomes one of the (111) set of planes. Similarly, the other leg of the "L" shaped pattern will have a tapered sidewall corresponding to another set of (111) planes. In the example shown in FIG. 5, the taper angle formed by the etched (111) side surface of the etched groove is 54.75° from the horizontal surface. Thus a rectangular feature such as a mesa or a well, whose edges are made of mutually orthogonal lines, can be formed with fixed inclinations. An "L" shaped feature or a rectangular perimeter, has two distinct type of corners: convex type 115 and concave type 125. Experiments and modelling with convex type corner by O. Than and S. Buttgenbach ("Simulation of anisotropic etching of crystalline silicon using a cellular automata model", Sensors and Actuators A 45 (1994) pp 85–89) have shown that the fast underetching of convex corners can be easily compensated in mask designs and thereby allow the formation of well controlled shapes, as shown in FIG. 5, to be achieved. In the following, this effect on corner etching, and the method to overcome them will be assumed and not discussed.

The etch rates of the anisotropic etchants preferred in the present invention are also affected by the amount of dopants in the silicon. If the concentration of dopants are in the $10^{19}$ to $10^{21}$ range, as is the case for a p+ layer, and in the range of $10^{16}$ to $10^{18}$ for a p– device layer, KOH based etch solutions etch the p– layer at a rate which is 100 times faster than the etch rate of the p+ layer. It is known that the preferred impurity used for doping silicon p type is boron and that for n type is arsenic, phosphorus or antimony. In the fabrication of SOI structures, the present invention combines the preferred etching caused by crystallographic planes and the high differential etching based on dopant concentration to achieve a highly controlled geometrical patterns of predictable slopes and depths.

Figure 6A:
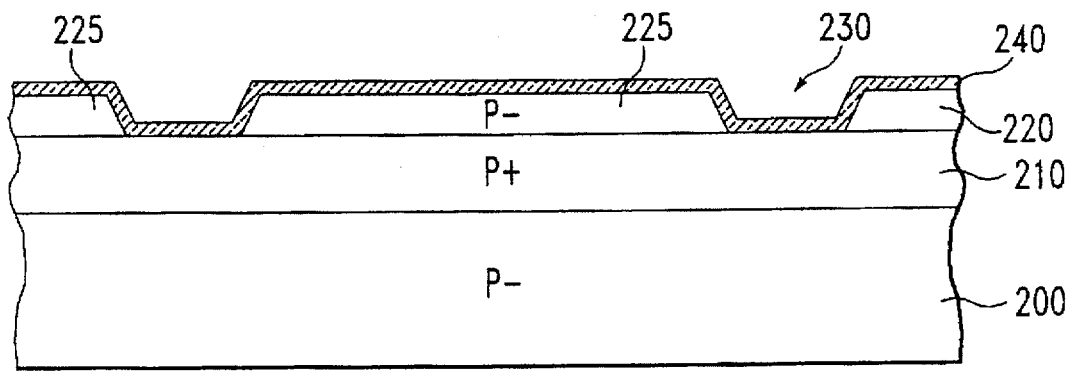
FIGS. 6A–6E show a series of cross-sections illustrating process steps taught in a first embodiment of the present invention.

Referring to FIG. 6A, a device substrate 200 with a p– conductivity, has a p+ layer 210 overlying substrate 200, and which is deposited preferably by epitaxial methods. The thickness of layer 210 is typically chosen in the range of 0.5 to several microns, the preferred thickness being in the range of 1 micron. Layer 210 serves as an etch stop layer for forming the sloped grooves 230, as well as an etch stop for thinning substrate 200 subsequent to bonding. Sometimes the etch stop layer 210 is formed of a series of stacked p+, p–, p+ layers to improve its performance as an etch stop. These sequential layers are all preferably formed using epitaxial deposition. A p– epitaxial layer 220 of preferred thickness is formed over layer 210. Layer 220 will also be referred to as the device layer, as this layer is used to form devices, at the end of the joining and thinning processes. The thickness of layer 220 can range from 1KÅ to a couple of microns, the preferred thickness being 5KÅ. By using known lithographic processes, a mask is formed over layer 220 with openings corresponding to recessed narrow regions 230, herein referred to as grooves, between the mesas. The mesa regions 225 can typically contain many circuits and represent sometimes a single silicon chip. The mask pattern for this step will correspond to a series of mutually orthogonal intersecting lines traversing the entire length and width of the substrate. The mesa 225 typically has a width ranging from 0.5 cm to 2 cm on each side. In comparison, the widths of the grooves are typically several microns wide and the depth corresponds to the device layer thickness, which is about 0.1 to 1 micron. Depending on the etch conditions, (i.e., the temperature, the concentration of KOH and the etch rate), the stability of the hard baked organic resist mask may be insufficient. Hot alkaline solutions can cause local delamination of organic resist. In that case, a hard protective layer of SiN, $SiO_2$, or other material can be used as the mask with a thickness of about 1KÅ for the Si wet etching process. These masks, in turn, are patterned by standard lithography masking and dry or wet etching processes. The mask pattern is oriented along one of the preferred crystallographic directions so that the groove 230 with its sloped side surface profile as shown in FIG. 5, is formed. Subsequently, the entire surface of the wafer is oxidized to form layer 240, the thickness of layer 240 ranging from 1KÅ to 10KÅ. The oxide layer 240 can also be deposited using a CVD, PECVD or sputtering processes.

Figure 6B:
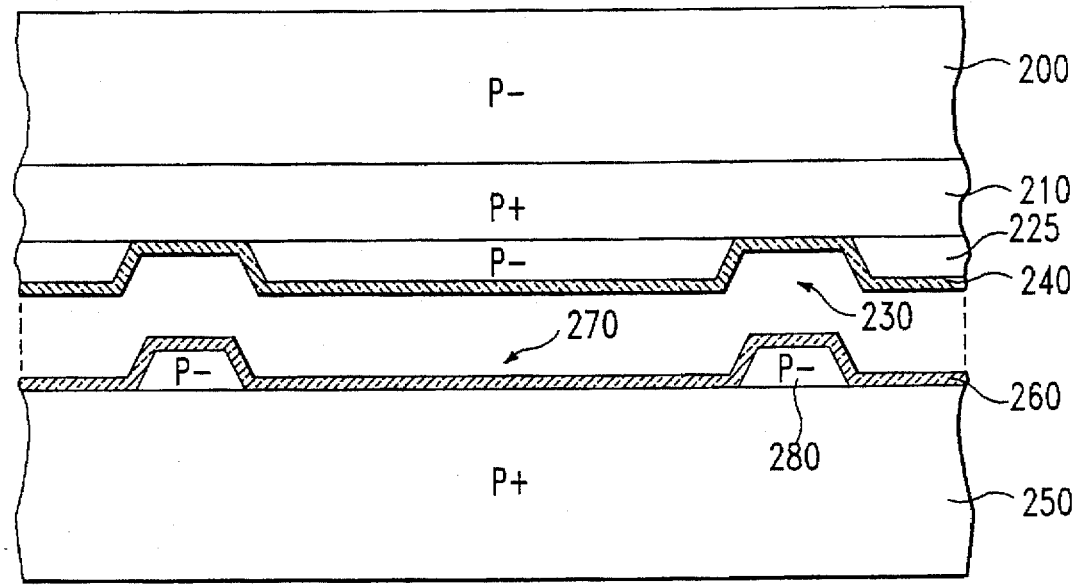
Figure 6C:
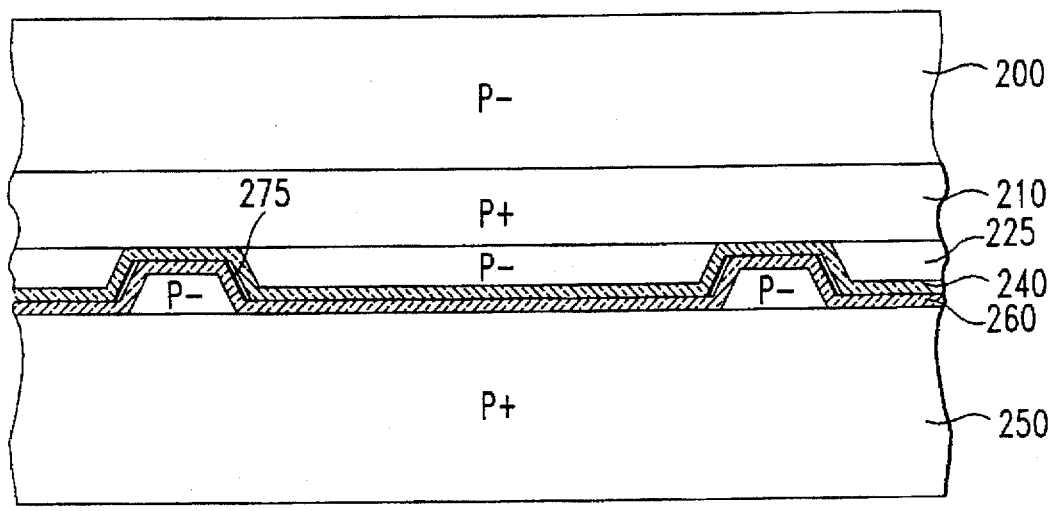

FIG. 6B shows two substrates: substrate 200 discussed earlier in FIG. 6A, and a carrier substrate 250. Referring to carrier substrate 250, it contains large areas 270 (referred to as wells) that have been etched into substrate 250. The starting substrate 250 is preferably a doped p+ substrate with a p– or intrinsic Si layer (corresponding to ridge regions 280), which has been anisotropically etched down to the p+ surface using processes described earlier in association with substrate 200. In the case of substrate 250, the lithographic process exposes the large areas corresponding to wells 270, which are approximately complementary to the regions 225 on substrate 200. In this case, the hard mask protects areas between the well regions. The use of anisotropic etchants results in sloped sidewalls of the remaining ridge regions 280 as shown in FIG. 6B. The differential etch rate of p– to p+ has been used to control the depth of the well formation in a precise manner. The etchant used is preferably KOH and the etch time is determined by separate experiments. A slight overetching is practiced in wet etching to allow for any non-uniformity of etching and further benefitting from the p+ etch stop layers. In a preferred embodiment, a surface oxide layer 260 is formed, preferably by thermal oxidation or by a chemical vapor deposition technique. The thickness of layer 280 is chosen to be less than the depth of regions 230, to assure that the flat surfaces of the mesas 225 and wells 270 make positive contact. Further, the ridge regions 280 are formed to be slightly narrower than the width of the recesses 230. These considerations has been shown in FIG. 6B, by the placing of the complementary features of substrates 200 and 250 adjacent to each other, and are further shown in a bonded position in FIG. 6C. The ridges 280 of substrate 250 are by deliberate design made narrower than the grooves 230 of substrate 200, the purpose of which is to assure that when substrates 200 and 250 are brought together, there is sufficient clearance in the mating areas of 280 and 230 to allow for any wafer warpage and pattern misalignment differences such as etch, mask and print biases, and also to assure that there is sufficient lateral play. This additional clearance width can be several microns and these spaces becomes void regions in the bonded substrates and act as a reservoir for dirt particles. Prior to mating, the substrate surfaces are cleaned using standard wafer cleaning techniques and assembled in a clean room. FIG. 6C is a cross section of the physically assembled substrates.

Figure 6D:
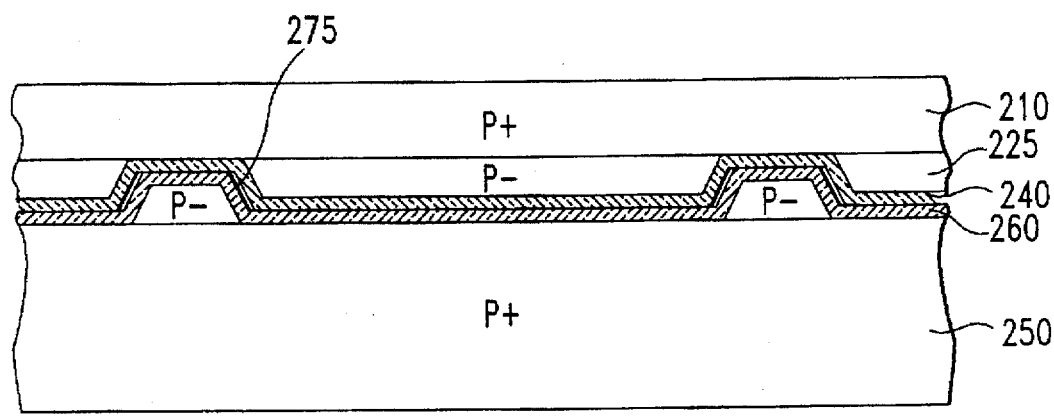
Figure 6E:
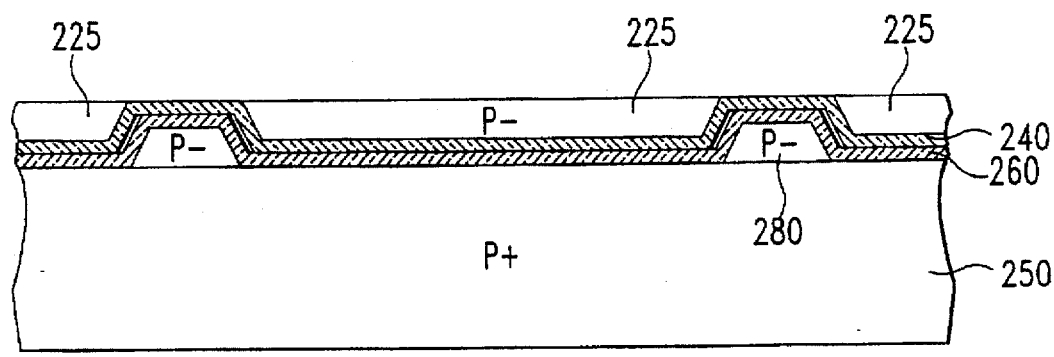

Sometimes the wafer surfaces are hydroxilated to promote physical bonding between the substrates, and to impart sufficient handling strength. A high temperature anneal is optionally used to promote chemical bonding between the two surfaces 240 and 260 at the major surfaces of contact. Referring to FIG. 6D, the p− substrate region 200 has been etched away, preferably using above described process steps. The etch stop layer 210 as mentioned earlier can be made of either a single p+ layer or a stack of p+ and p− layers; in either case, it is the objective to help thin the p− substrate 200 without substantially affecting the uniformity of layer 210. Layer 210 is preferably removed by a chemical mechanical polish or a reactive ion etch process. The resulting structure after the removal of layer 210 is shown in FIG. 6E, with islands of device regions 225 supported on oxide layers 240 and 260 and separated by non-device regions 280 on a mechanically rigid substrate 250.

Figure 1:
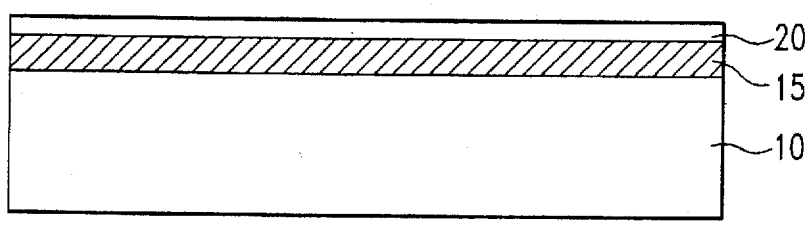
FIG. 1 is a cross section of a prior art silicon on insulator (SOI) wafer.
Figure 2A:
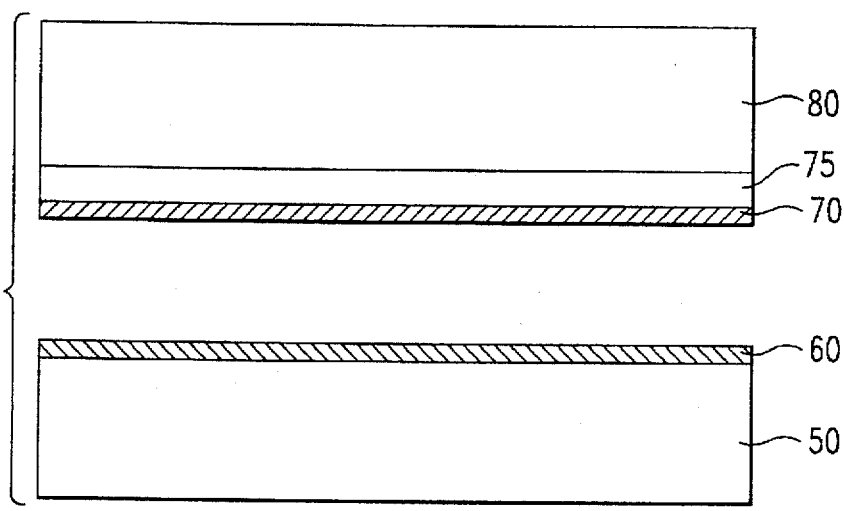
FIGS. 2A–2C are cross sections illustrating a prior art process for SOI wafers using bonding and thinning.
Figure 2B:
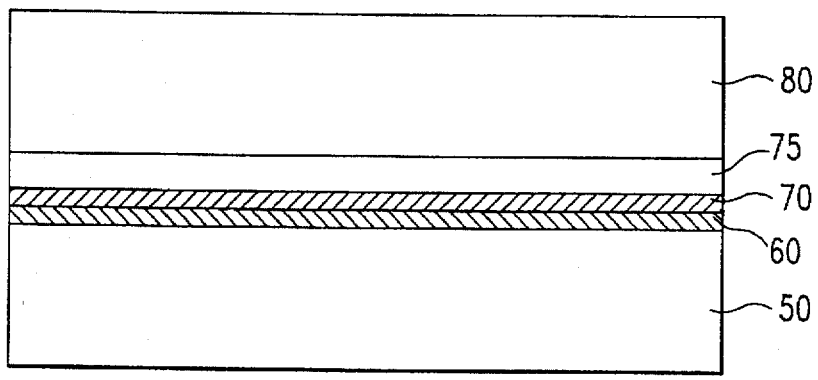
Figure 2C:
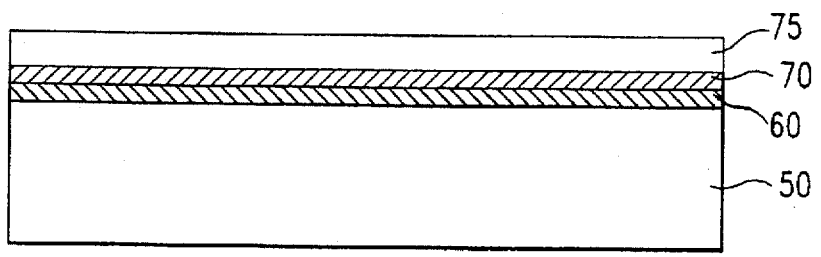
Figure 3A:
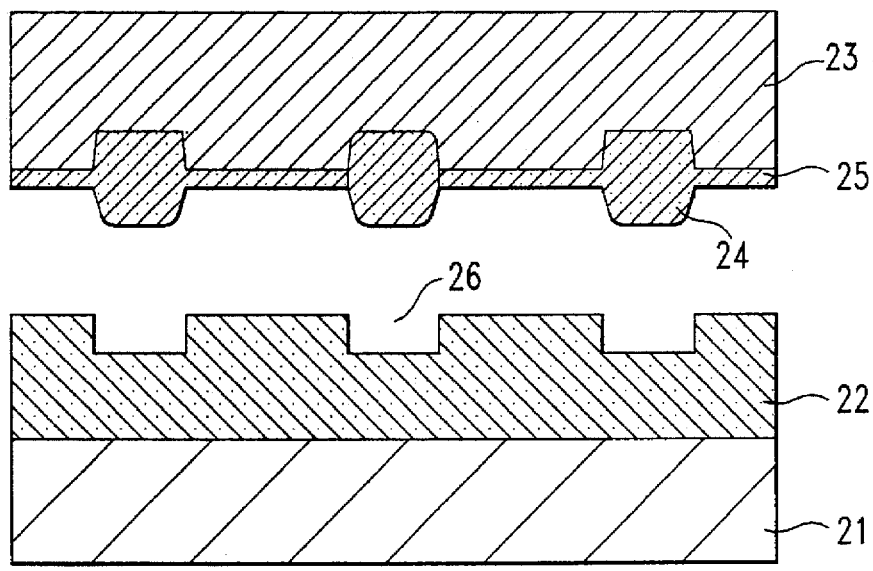
FIGS. 3A–3C illustrate another prior art SOI process using bonding and thinning.
Figure 3B:
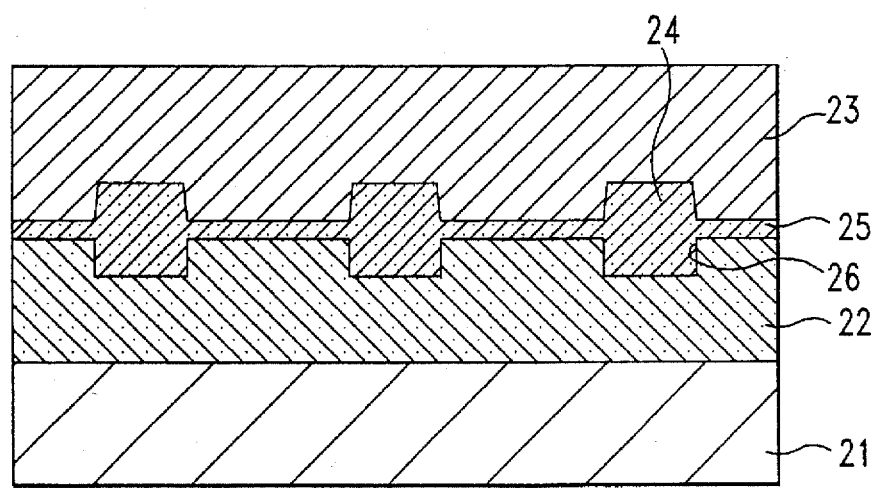
Figure 3C:
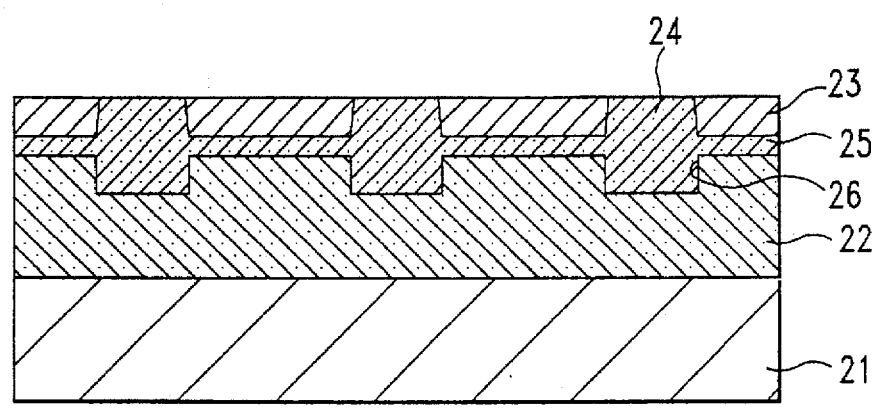
Figure 7A:
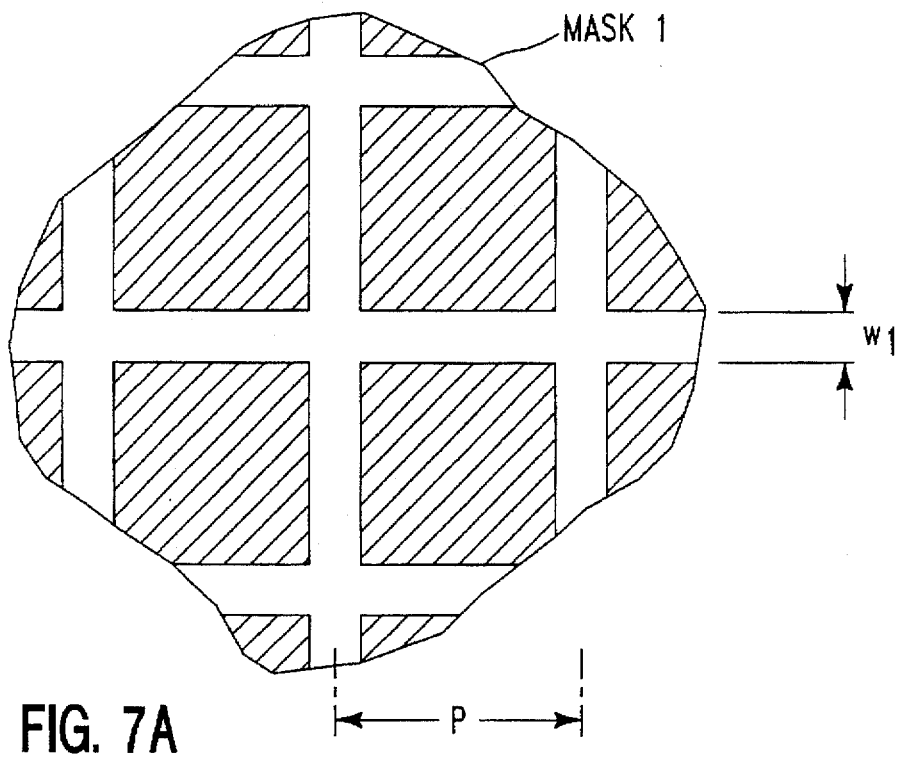
FIGS. 7A–7B illustrate the complementary masks used for patterning the device and support substrate.
Figure 7B:
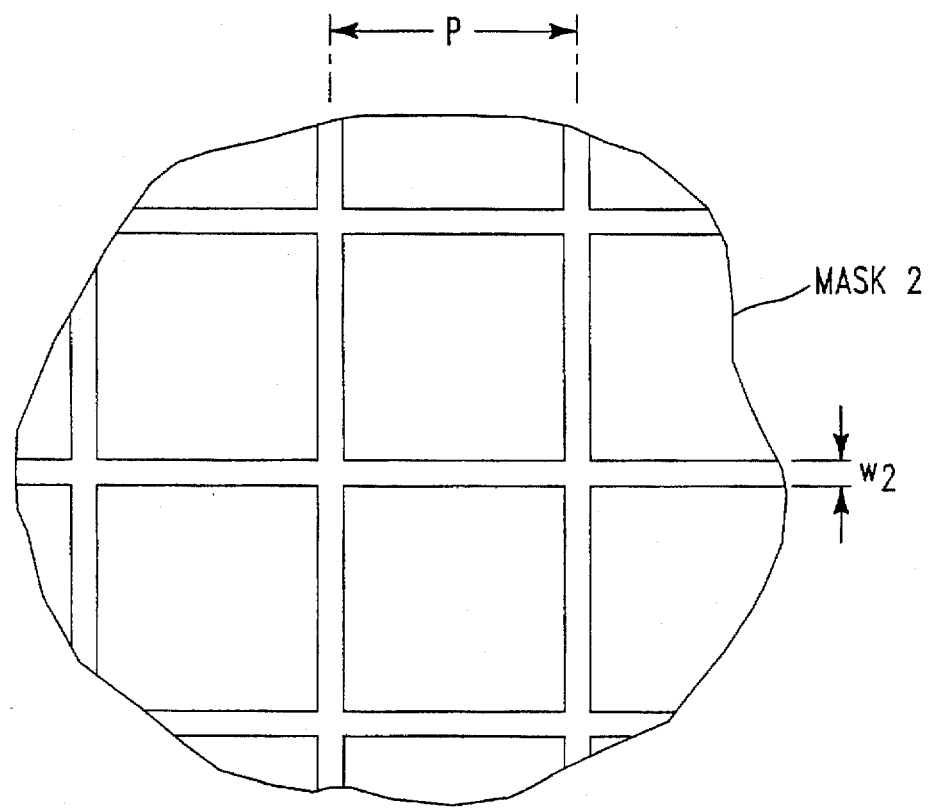

FIGS. 7A and 7B show a cut-away top view of a set of masks that can be used with projection lithography to create square wells and mesas. Mask 1 is used to create the mesas in the device substrate. Mask 1 has shaded and clear regions, the clear regions corresponding to the grooves between the mesas. It may be required to modify mask feature shapes of the corners of the rectangular region if etching of the corners become accelerated (See, "Anisotropic Etching of Crystalline Silicon in Alkaline Solutions I and II", H. Seidel et al., J. Electrochemical Soc., Vol. 137, No. 11, November 1990, pp 3612–3632) This is a function of the etch depth and etch chemicals used. This modification of the mask shapes is not shown in FIG. 1. The clear regions in mask 2 are used to create the well regions in the carrier substrate. FIG. 7A shows that the square or rectangular features have a periodicity of "p" and a spacing of "w1".

FIG. 7B shows that the intersecting shaded regions have a width of "w2" and are separated by a periodicity "p". The width w1 determines the width of the top of the groove in substrate 200 and w2 represent the width of the top of the ridge in substrate 220. In the present invention, w1 is designed larger than w2 to compensate for process tolerances and also to take into account the sloped nature of the edges. In addition w1 will be made wider to allow for ease of assembly and allow for some sliding to accommodate wafer warpage. To illustrate the selection of various thicknesses and mask dimensions, the following example is given. In this example, layer 220 is 0chosen to be 5KÅ and layer 280 is chosen to be 4KÅ thick. The mask, print and process bias all together have an assumed tolerance of 1 micron. If w1 is chosen to be 10 microns, then w2 is chosen to be less than 8 microns. The allowance for sloped sidewall is equal to 2×5KÅ÷tan 54.7°, which is approximately 0.7 micron. Therefore, a 3 micron difference allows for a 1 micron process bias, 0.7 micron for sidewalls slopes, and 1.3 microns for lateral clearance. In practice it may be preferable to allow a larger value for lateral clearance. For example, if w1 is chosen to be 10 microns, w2 can be chosen to be about 5 microns. It may be desirable to make the general widths w1 and w2 to be much larger; i.e., in the range of 10 to 500 microns, for more robust sliding and insertion.

Figure 8A:
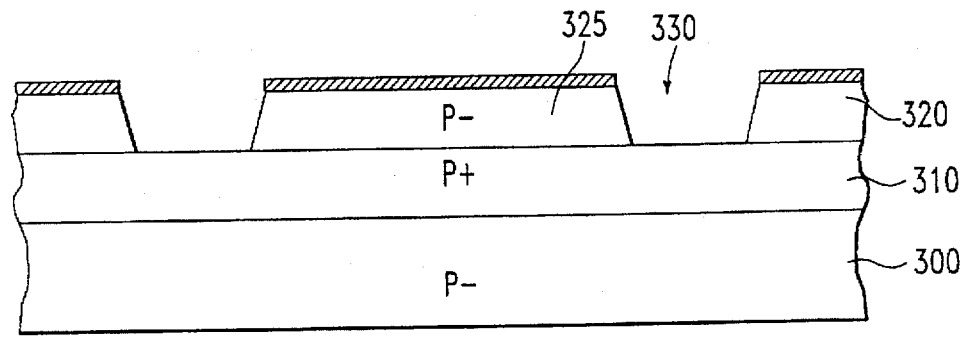
FIGS. 8A–8H show a series of cross-sections illustrating a second embodiment of the present invention.
Figure 8B:
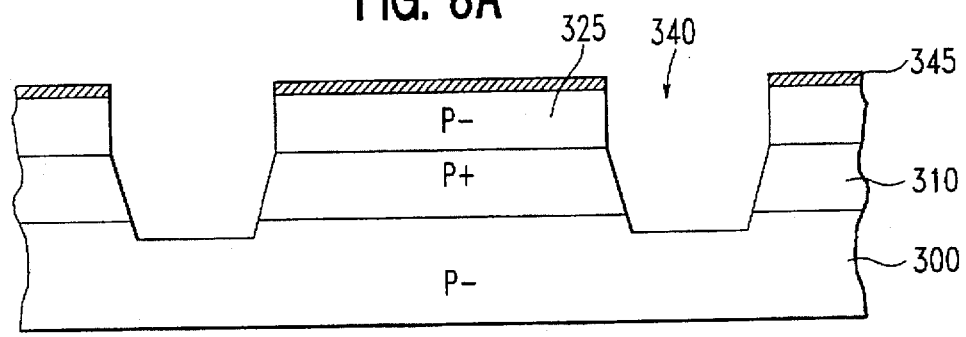
Figure 8C:
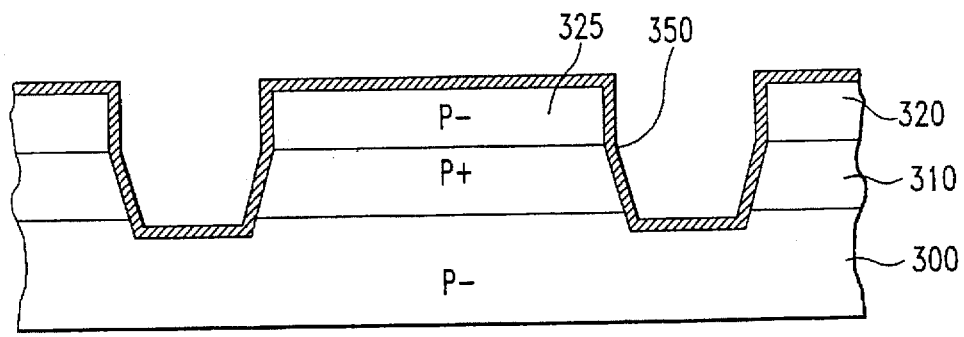
Figure 8D:
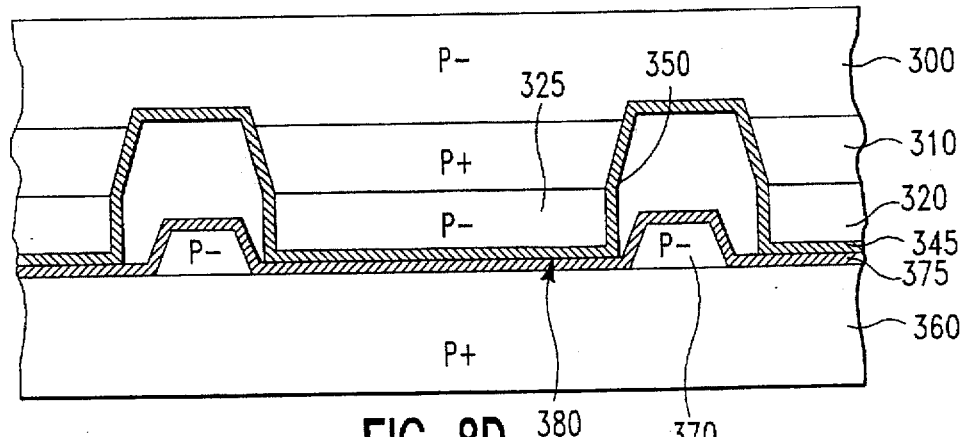

A second example of the invention combines a reactive ion etch process with an anisotropic wet etch process, and is illustrated in FIGS. 8A–8H. Referring to FIG. 8A, a device substrate 300 is shown with an etch stop layer 310 and a device layer 320. Using the preferred anisotropic etching process described earlier, a plurality of grooves 330 with angular slopes are etched into layer 320 using layer 310 as an etch stop, forming a plurality of mesas 325. A directional reactive ion etching for a fixed time is used to transfer recess regions 330 deeper into the silicon and through the p+ layer, thereby creating grooves 340 of the shape shown. FIG. 8C shows an oxide layer 350 formed on the surface of the substrate including in the grooves 340. FIG. 8D shows a second substrate 360 with ridges 370 and wells with bottom surface 380, formed by masking and anisotropic etching techniques described earlier. Optionally, an oxide layer 375 is formed over the entire surface of the substrate 360, including the ridges 370. Substrates 300 and 360 are joined together so as to align the complementary features and to make physical contact between the top surface of mesas 325 of substrate 300 with the corresponding bottom surface 380 of the wells in substrate 360. If required a high temperature anneal is carried out to establish good bonding between the major flat surfaces of substrates 300 and 360.

Figure 8E:
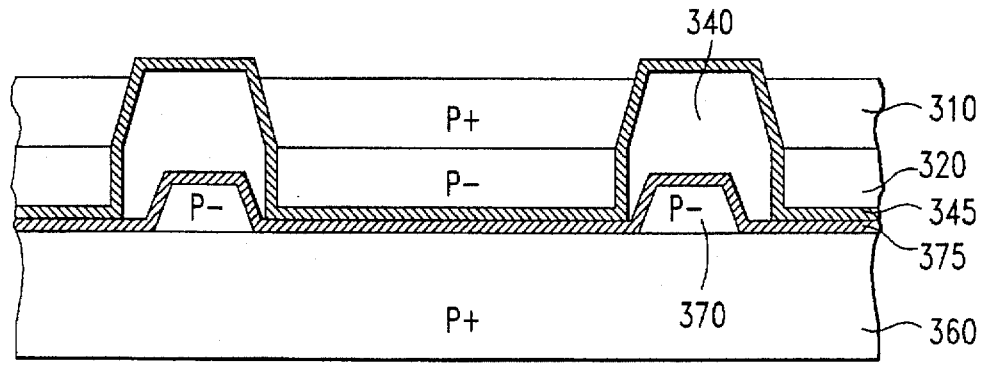
Figure 8F:
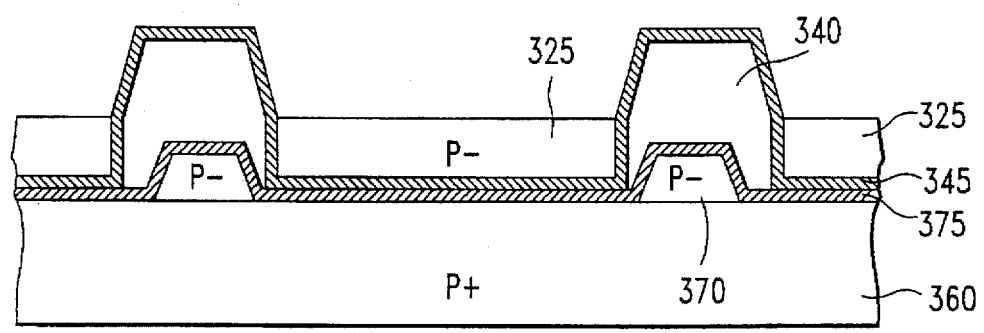
Figure 8G:
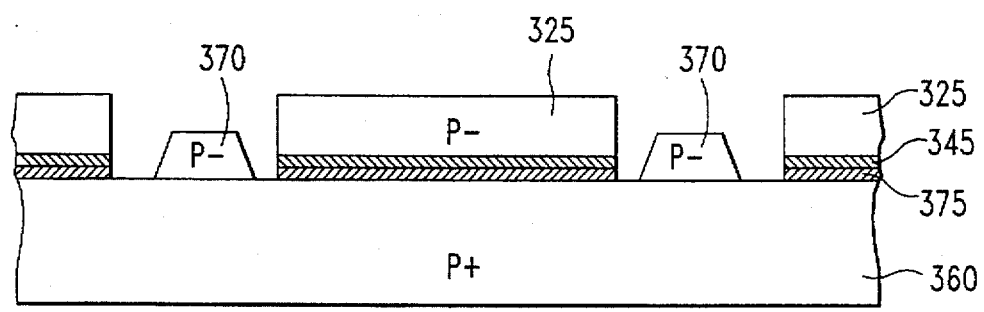
Figure 8H:
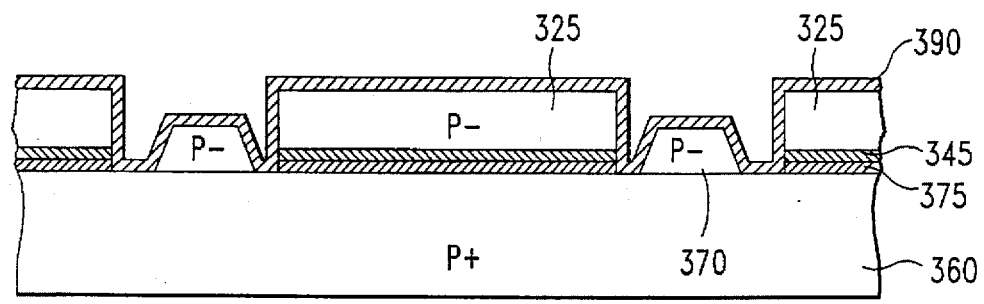

FIG. 8E shows the cross section of the bonded wafer when the p− regions 300 are completely removed, stopping on the oxide surface 350 and the etch stop layer 310. The preferred process is a wet etch process. Any other high silicon removal rate techniques that has selective etching with respect to highly doped regions as an etch stop layer would be equally acceptable. FIG. 8F shows the cross section of the structure after removing regions 310 using a reactive ion etch process. In the process shown, the reactive ion etch is highly selective to the silicon dioxide layer, using gases containing chlorine or bromine. The selective etch process, however, is optional and may not be required as the exposed oxide regions of layer 350 are subsequently removed. FIG. 8G shows the cross section after the removal of exposed silicon dioxide regions in the groove/ridge area ( usually kerf area in a Si wafer). FIG. 8H shows the reoxidation of the SOI substrate to form a layer 390 over the entire surface including the mesas 325. The primary difference between this example and the first example, is the incorporation of the reactive ion etch steps along with the anisotropic chemical wet etch, to present a greater degree of freedom to thickness tolerances of layer 320 and 370 without causing simultaneous widening of the openings 340. In product manufacturing, the kerf regions are removed in a dicing operation after the devices are built.

Figure 9A:
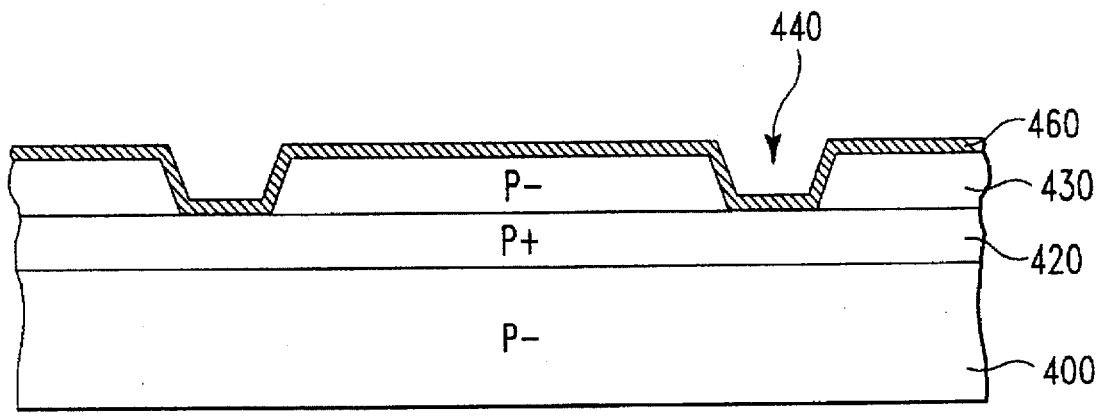
FIGS. 9A–9B show a third embodiment of the present invention.
Figure 9B:
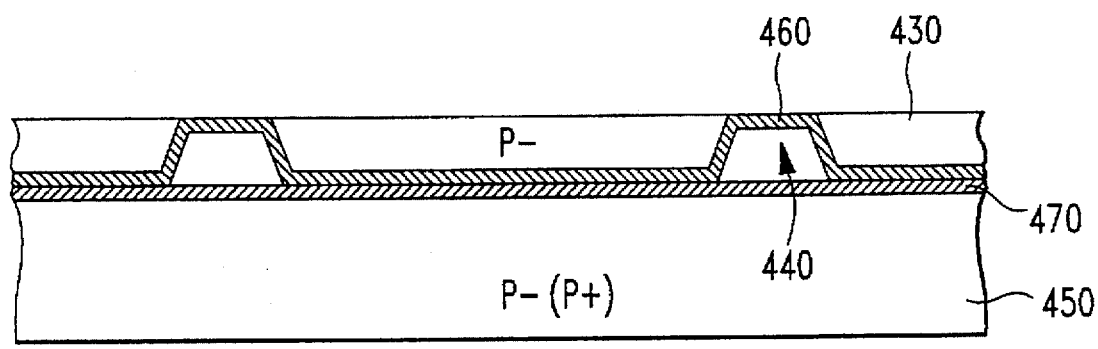

In a third example of the inventive process illustrated in FIGS. 9A and 9B, a device layer 430 on a device substrate 400 is patterned to have mesa regions 430 and grooves 440 using the anisotropic etching process described in the earlier examples. An etch stop layer 420 is optionally used to provide better control in removing substrate 400 subsequent to bonding process. Optionally an oxide layer 460 is formed over the entire surface of substrate 400 including the grooves 440. A planar carrier substrate 450 with a blanket oxide layer 470 is joined to the patterned substrate 400 so that the major top surface of the mesas 430 are in physical contact with the substrate 450. In this case, there is no need to have precise alignment, while at the same time the grooves 440 act to provide a location for collection surface dust to improve the bonding yield. Subsequent to joining, the device substrate 400 and the etch stop layer 420 are removed by techniques described earlier to achieve a structure as shown in FIG. 9B. Whereas all of the above first, second, and third examples have been described using p doped layers of different concentration, it is equally feasible to achieve similar structures using n– device layers with appropriate etch process modifications. Therefore, SOI substrates of both n– and p– can be readily obtained by the methods as taught herein.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of forming a device layer on an insulating layer on a substrate, comprising the steps of:
    a) providing a first substrate of a first conductivity, having a device layer of a second conductivity and a first thickness;
    b) providing a second substrate of a third conductivity;
    c) etching the first substrate including said device layer to a first depth thereby forming a set of mesa regions in said device layer thereon, said mesa regions having a top surface;
    d) etching the second substrate to a second depth thereby forming a set of well regions thereon, said well regions having a bottom surface;
    e) forming an insulating layer over the entire surface of at least one of the first substrate including the top surface of the mesas the second substrate including the bottom surface of the well regions;
    f) joining the first and second substrates so as to establish physical contact between the top surface of the mesa regions and the bottom surface of the well regions; and
    g) removing most of the thickness of the first substrate, thereby leaving behind substantially the mesa regions on top of said second substrate.

2. The method of claim 1, wherein said first substrate further has an etch stop layer of a fourth conductivity between said device layer and said substrate.

3. The method of claim 1, wherein said second substrate further has a silicon layer of a second thickness and of a fifth conductivity beneath the bonding layer.

4. The method of claim 1, wherein said first and second substrates are single crystal silicon with (100) surface.

5. The method of claim 1, wherein said first conductivity is characterized by impurities having a concentration of $10^{19}$/cc to $10^{21}$/cc, selected from the group consisting of p and n dopants, and said second conductivity is characterized by impurities having a concentration of $10^{16}$/cc to $10^{18}$/cc, selected from the group consisting of p and n dopants.

6. The method of claim 2, wherein said fourth conductivity is characterized by impurities having a concentration of $10^{19}$/cc to $10^{21}$/cc, selected from the group consisting of p and n dopants, and said first conductivity is characterized by impurities having a concentration of $10^{16}$/cc to $10^{18}$/cc, selected from the group consisting of p and n dopants.

7. The method of claim 3, wherein said fifth conductivity is characterized by impurities having a concentration of $10^{16}$/cc to $10^{18}$/cc, selected from the group consisting of p and n dopants.

8. The method of claim 3, wherein said silicon layer is intrinsic.

9. The method of claim 1, wherein said first depth is equal to the first thickness of said device layer.

10. The method of claim 3, wherein said second depth is equal to the second thickness of said silicon layer.

11. The method of claim 1, wherein said etching process is an anisotropic wet etch process.

12. The method of claim 11, wherein said anisotropic wet etch process uses a solution comprising a chemical selected from the group consisting of KOH, hydrazine, ethylenediamine, and sodium silicates.

13. The method of claim 1, wherein said etching is carried out by first etching using an anisotropic wet etch process, followed by etching using a reactive ion etch process.

14. The method of claim 13, wherein said reactive ion etch uses gases selected from the group consisting of fluorocarbons.

15. The method of claim 1, wherein said mesas and wells have a sloped side surface from the etching process.

16. The method of claim 1, wherein said insulating layer is formed using a process selected from the group consisting of thermal oxidation, chemical vapor deposition, sputtering and plasma enhanced chemical vapor deposition.

17. The method of claim 1, wherein said insulating layer is silicon dioxide having a thickness selected from 100 Å to 20,000 Å.

18. The method of claim 1, wherein said joining process further comprises the steps of:
    cleaning said first and second substrates to remove any particulates; and
    treating surfaces of said first and second substrates chemically, to hydrolyze the surfaces to promote physical bonding.

19. A method of forming a device layer on an insulating layer on a substrate, comprising the steps of:
    a) providing a first substrate of a first conductivity, having a device layer of a second conductivity and a first thickness;
    b) providing a second substrate of a third conductivity having a selected major surface;
    c) etching the first substrate including said device layer to a first depth thereby forming a set of mesa regions in said device layer thereon, said mesas having a top surface;
    d) forming an insulating layer on at least one of the surface of the first substrate containing the mesas regions and the major selected surface of the second substrate;
    e) joining the first and second substrates by establishing physical contact between top surface of the mesa regions and the selected major surface of the second substrate; and
    f) removing most of the first substrate, thereby leaving behind the mesa regions on top of said second substrate.

20. The method of claim 19, wherein said first substrate further has an etch stop layer of a third conductivity between said device layer and said substrate.

21. The method of claim 19, wherein said first and second substrates are single crystal silicon with (100) surface.

22. The method of claim 20, wherein said etch stop layer is characterized by impurities having a concentration of $10^{19}$ to $10^{21}$/cc, selected from the group consisting of p and n dopants, and said first substrate is characterized by impurities having a concentration of $10^{16}$ to $10^{18}$/cc, selected from the group consisting of p and n dopants.

23. The method of claim 19, wherein said device layer is selected from the group consisting of p– and n– doped layers and the first substrate is selected from the group consisting of p+ and n+ substrates.

24. The method of claim 19, wherein said first etched depth is the same as the first thickness of the device layer.

25. The method of claim 19, wherein said etching process is an anisotropic wet etch process.

26. The method of claim 25, wherein said anisotropic etch process uses a solution comprising a chemical selected from the group consisting of KOH, hydrazine, ethylenediamine or sodium silicates.

27. The method of claim 19, wherein said etching is carried out by first etching using an anisotropic wet etch followed by reactive ion etching.

28. The method of claim 27, wherein said reactive ion etch uses gases selected from the group consisting of fluorocarbons.

29. The method of claim 19, wherein said mesas have a sloped side surface from the etching process.

30. The method of claim 19, wherein said insulating layer is formed using a process selected from the group consisting of thermal oxidation, chemical vapor deposition, sputtering and plasma enhanced chemical vapor deposition.

31. The method of claim 19, wherein said insulating layer is silicon dioxide with a thickness selected from 100 Å to 20.000 Å.

32. The method of claim 19, wherein said joining process further comprises the step of:

cleaning said first and second substrates to remove any particulates; and treating surfaces of said first and second substrates chemically, to hydrolyze the surfaces to promote physical bonding.

* * * * *